(12) United States Patent
Feldmeier et al.

(10) Patent No.: US 7,705,234 B2
(45) Date of Patent: Apr. 27, 2010

(54) SOLAR MODULE HAVING A CONNECTING ELEMENT

(75) Inventors: Guenter Feldmeier, Lorsch (DE); Heinz Scherer, Bensheim (DE); Andreas Woeber, Kronau (DE)

(73) Assignee: Tyco Electronics AMP GmbH, Bensheim (DE)

( * ) Notice: Subject to any disclaimer, the term of this patent is extended or adjusted under 35 U.S.C. 154(b) by 803 days.

(21) Appl. No.: 11/136,867

(22) Filed: May 25, 2005

(65) Prior Publication Data

US 2006/0000504 A1    Jan. 5, 2006

(30) Foreign Application Priority Data

May 25, 2004    (DE)    ........................ 10 2004 025 627

(51) Int. Cl.
*H01L 21/00* (2006.01)
*H02N 6/00* (2006.01)
*H01L 25/00* (2006.01)

(52) U.S. Cl. .................. 136/251; 136/259; 439/63; 438/64

(58) Field of Classification Search ................. 136/251; 439/63, 76.1; 438/64
See application file for complete search history.

(56) References Cited

U.S. PATENT DOCUMENTS

| | | | | |
|---|---|---|---|---|
| 3,611,270 A | * | 10/1971 | Eppler | 439/634 |
| 4,708,417 A | * | 11/1987 | Woertz | 439/828 |
| 4,798,545 A | * | 1/1989 | Roy et al. | 439/677 |
| 5,268,038 A | * | 12/1993 | Riermeier et al. | 136/251 |
| 5,503,684 A | | 4/1996 | Duran | |
| 6,066,797 A | * | 5/2000 | Toyomura et al. | 136/251 |
| 6,166,321 A | * | 12/2000 | Sasaoka et al. | 136/251 |
| 6,257,900 B1 | * | 7/2001 | Huang et al. | 439/74 |
| 6,307,144 B1 | * | 10/2001 | Mimura et al. | 136/244 |
| 2004/0043670 A1 | * | 3/2004 | Feldmeier et al. | 439/709 |
| 2005/0054219 A1 | * | 3/2005 | Werner et al. | 439/76.1 |
| 2005/0054244 A1 | * | 3/2005 | Werner et al. | 439/682 |
| 2006/0099833 A1 | * | 5/2006 | Mann | 439/63 |

FOREIGN PATENT DOCUMENTS

| | | | |
|---|---|---|---|
| DE | 102 41 728 A1 | | 3/2004 |
| EP | 0 521 189 A1 | | 1/1993 |
| EP | 1 102 354 A2 | | 5/2001 |
| WO | WO 2004/025995 | * | 3/2004 |

* cited by examiner

*Primary Examiner*—Jennifer K Michener
*Assistant Examiner*—Golam Mowla
(74) *Attorney, Agent, or Firm*—Barley Snyder LLC

(57) ABSTRACT

A solar module having a housing and a solar element is described, wherein the housing comprises a connecting element, which is connected to the contact surface of the solar element in an electrically conductive manner. Furthermore the connecting element is connected to electrical connection sockets, by means of which connecting conductors may be connected. A contact element which is biased against the contact surfaces of the solar elements is arranged between the connecting element and the contact surfaces of the solar element as a contact element. As a result of this, soldered, clamped or screwed connections between the solar element and the connecting element are unnecessary. A simple and cost-effective automated production of the solar module is thus made possible.

16 Claims, 2 Drawing Sheets

SOLAR MODULE HAVING A CONNECTING ELEMENT

FIELD OF THE INVENTION

The invention relates to a solar module having a connecting element and to a method for producing a solar module.

BACKGROUND

Solar modules substantially consist of a substrate, on which a plurality of lamellar or discoidal solar cells are arranged and electrically interconnected. In order to protect the solar cells against atmospheric influence, the solar cells are arranged in a frame and are covered by a cover layer on both sides. A transparent cover is provided on the light-sensitive side of the solar cells. The back of the solar cells is covered by a compound foil or a glass sheet.

A solar cell includes electrical conductors for taping the voltage that is generated in the solar cell during exposure to light. Connecting elements are arranged on the housing of the solar module between the electrical conductors of the solar cells and external wires in order to conduct current.

A connection box for making electrical contact with foil conductors of a solar cell is known from the patent application EP 1102354 A2. The connection box comprises an opening in the base, through which the foil conductors of the solar module are guided into the connection box. Connecting contacts connected to the foil conductors are provided in the connection box. The connecting contacts are in turn connected to connection sockets, for receiving wires.

An electrical connecting element for a solar module, which affords a simple method of making an electric connection, is known from patent application EP 0521189 A1. A connecting element, which is configured in the shape of a bolt and is soldered to the back of the solar module, is provided for this purpose. A fastening element, which is glued to the solar module, is arranged above the connecting element.

SUMMARY

An object of the invention, among others, is to provide a solar module having a connecting element that may be produced easily and cost-effectively.

This and other objects of the invention are achieved by a solar module having a solar element which includes a contact surface. A connection box housing is positioned on the solar element and has a connecting element for the connection of electrical wires. The connecting element is connected to the contact surface by a contact element which is resiliently biased against the contact surface of the solar element.

BRIEF DESCRIPTION OF THE DRAWINGS

The invention will be described below in greater detail with reference to figures, in which.

DETAILED DESCRIPTION OF THE EMBODIMENTS

Figure 1:
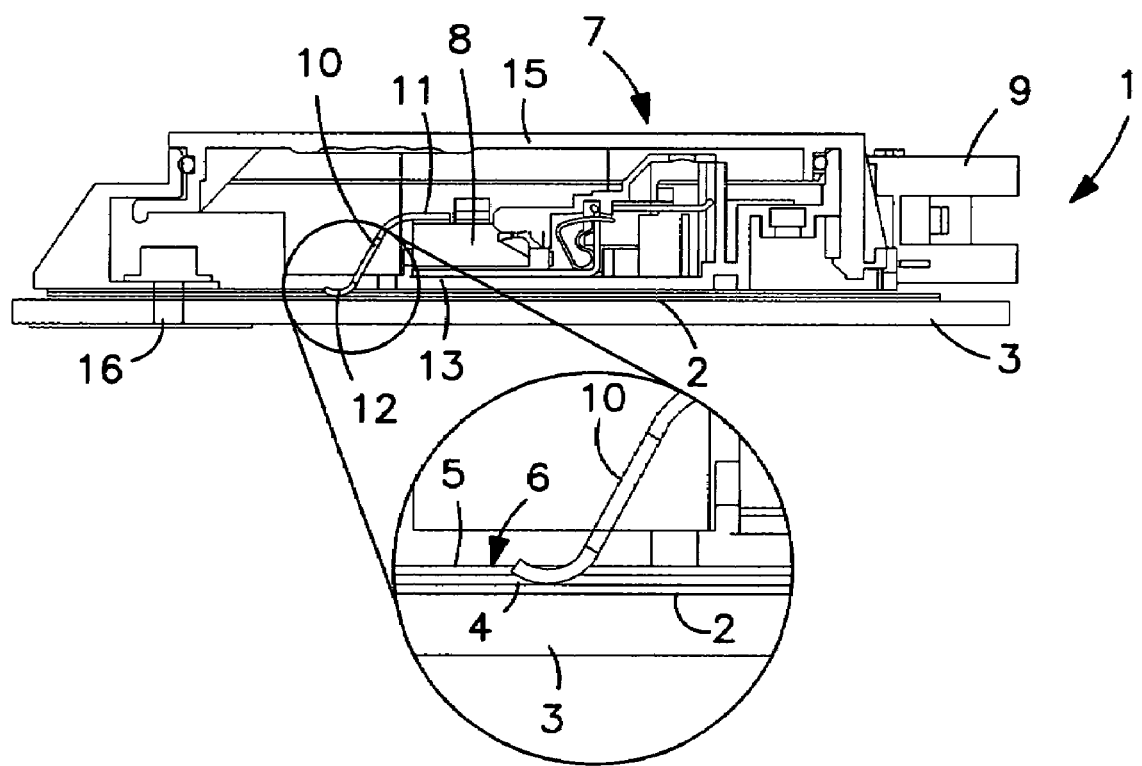
FIG. 1 is a cross-sectional view of a solar module having a connection box.
Figure 2:
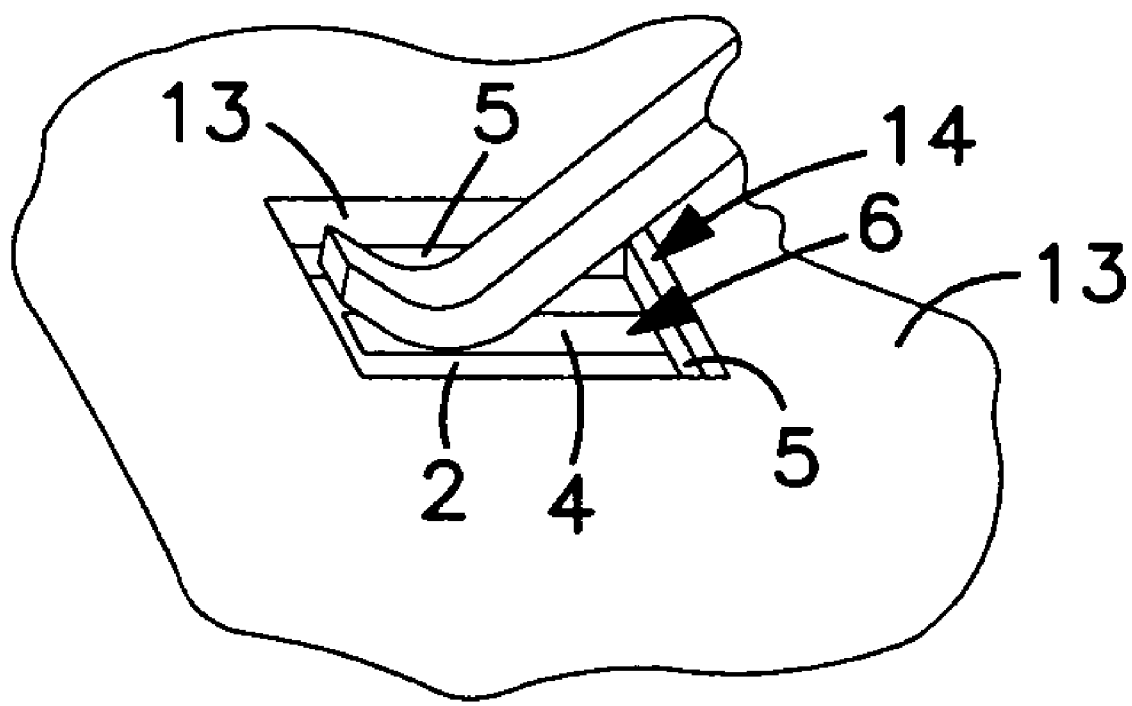
FIG. 2 is a detailed view of the contact region, in which a contact element lies on the contact surface 4 of the solar module.

FIG. 1 shows a cross-sectional view of a solar module 1, that comprises a solar element 2 having at least one solar cell. The solar element 2 comprises a glass cover 3 on the light sensitive side. Electrical contact surfaces 4 that are connected to electrical conductors of the solar element 2 are provided on the back of the solar element 2. Depending on the embodiment, a plurality of solar cells are electrically interconnected and the voltage generated by the solar cells is tapped via two contact surfaces 4. For the sake of simplicity only one contact surface 4 is illustrated in FIG. 1. Making electrical contact is preferably identical for both contact surfaces 4 and will be described below in greater detail with reference to a contact surface 4. FIG. 2 shows a detailed view of one of the contact surfaces 4.

The contact surfaces 4 may, for example, be configured in the form of conductor tracks or in the form of flat band conductors. The back of the solar element 2 is covered by a second cover 5. The second cover 5 may, for example, be a glass sheet or a compound foil. The second cover 5 comprises an opening 6 in the region of the contact surface 4. A connection box having a housing 7, which covers part of the back of the solar element 2, is attached to the back of the solar element 2. The housing 7 is attached to the solar element 2 by a suitable attachment such as, for example, an adhesive connection 16. A connecting element 8, which is connected to electric connection sockets 9 via electrical conductors, is arranged on the housing 7. Resiliently biased contact elements 10 are arranged between the connecting element 8 and the contact surfaces 4.

In the illustrated embodiment, the contact element 10 is in the form of a spring contact, which is connected to a connecting contact of the connecting element 8 by a first contact region 11 and lies on a contact surface 4 by means of a second contact region 12. The contact element 10 comprises a rounded contact section in the second contact region 12. This rounded contact section is, for example, achieved by the contact element 10 being configured in a curved manner in the second contact region 12. The contact element 10 is biased against the contact surface 4 via the second contact region 12. The contact element 10, utilizing its inherent spring stiffness, is biased against the contact surface 4.

The contact element 10 is produced from a material such as spring steel. The glass cover 3 having a solar element 2 and having a second cover 5 is attached to the housing 7 via an adhesive connection 16 and/or a mechanical connection. Wires may be attached to the connection sockets 9.

Only one contact element 10 is presented in the illustrated cross-section, however at least two contact surfaces 4 and two contact elements 10 respectively are usually provided for a solar element 2 for tapping the electrical voltage generated by the solar element 2. The connecting element 8 accordingly also comprises two connecting contacts for connecting the two contact elements 10. The second connecting contact is also connected to a second connection socket 9 in an electrically conductive manner.

The housing 7 comprises a housing base 13 and a housing lid 15. The connecting element 8 is arranged on the housing base 13. Further openings 14 through which the contact elements 10 are guided, as illustrated in FIG. 2, are provided in the regions above the contact surfaces 4 in the housing base 13. The housing base 13 has a substantially closed flat configuration in the other regions.

During mounting of the preassembled housing 7, which already has the connecting element 8 having the connected connection sockets 9 and the contact elements 10 built-in, the solar element 2 having the glass cover 3 and the second cover 5 is placed onto the housing base 13 and is connected to the housing 7 via an adhesive and/or a mechanical connection. This allows automated fastening of the connection socket and allows automated electrical contact to be made between the solar element 2 and the connecting element 8 as no soldered, clamp or screw connection is required between the contact surfaces 4 of the solar element 2 and the connecting element 8. Instead, a simple resilient contacting via a contact element 5 is used.

An advantage of the solar module 1 according to the invention is that the solar module 1 may be produced easily and cost-effectively in an automated production process. The automated production of the solar module 1 is made possible by the contact element 10 being resiliently biased against a contact surface 4 of a solar module. It is thus not necessary to provide soldered, clamped or screwed connections for making electrical contact with the solar cells. Furthermore, the embodiment of a contact element 10 formed as a spring contact offers a simple and cost-effective configuration of the resiliently biased contact element. Reliable contact with the contact surface 4 is achieved because of the rounded shape of the contact region 12. The curvature of the contact region 12 is achieved in a simple manner by the bending of the contact element.

What is claimed is:

1. A solar module comprising:
    a solar element having a contact surface and a transparent cover;
    a second cover positioned directly above the solar element and covering the back of the solar element;
    a connection box housing preassembled and having a housing base placed onto the second cover and having an opening that exposes a portion of the contact surface and the second cover, and a connecting element for the connection of electrical wires with connection sockets, the preassembled housing positioned on the solar element such that the flat housing base is mounted on the second cover; and—
    a contact element connecting the connecting element to the contact surface, the contact element being a spring contact having a first contact region extending substantially parallel to the contact surface that is connected to the connecting element and a second contact region extending diagonally from the first contact region that has a rounded contact section resiliently biased against the contact surface by the second contact region, the second contact region extending beyond the opening provided in the housing base and the second cover while contacting the exposed contact surface;
    wherein the connection sockets and the contact element are built-in to the preassembled housing.

2. The solar module of claim 1, wherein the contact element is fixed between the connecting element and the contact surface.

3. The solar module of claim 1, wherein the second cover is a foil or a glass sheet, on the side on which the contact surface is arranged, and the second cover has an opening, through which the contact element passes to contact the contact surface.

4. The solar module of claim 1, wherein the connection box is attached to the solar module by an adhesive or a mechanical connection.

5. A method for producing a solar module comprising the steps of:
    providing a solar element having a transparent cover and at least one contact surface for tapping voltage which is generated by the solar element;
    providing a second cover that covers the back of the solar element;
    providing a preassembled connection box housing having a flat housing base placed onto the second cover and having an opening that exposes only a portion of the contact surface and second cover, and a connecting element for the connection of electrical wires with connection sockets, the preassembled housing positioned on the solar element such that the flat housing base is mounted on the second cover, at least one contact element connecting the connecting element with the contact surface, the contact element being a spring contact having a first contact region extending substantially parallel to the contact surface that is connected to the connecting element and a second contact region extending diagonally from the first contact region that has a rounded contact section, the second contact region extending beyond the opening provided in the housing base and the second cover while contacting the exposed contact surface, wherein the connection sockets and the contact element are built-in to the preassembled housing; and
    attaching the connection box to the solar element such that the rounded contact section is resiliently biased against the contact surface of the solar element by the second contact region.

6. The method of claim 5, wherein attaching the connection box to the solar module comprises the application of an adhesive or a mechanical connection.

7. The method of claim 5, further comprising the step of covering the solar element with the second cover made of foil or the glass sheet, on the side on which the contact surface is arranged, and providing an opening in the second cover for passing the contact element.

8. The solar module of claim 3, wherein the rounded contact section is arranged in the opening.

9. The solar module of claim 8, wherein the housing base is provided with a further opening and the rounded contact section is at least partially arranged in the further opening in the housing base.

10. The method of claim 7, wherein the rounded contact section is arranged in the opening.

11. The method of claim 10, wherein the housing base is provided with a further opening and the rounded contact section is at least partially arranged in the further opening in the housing base.

12. A connection box for a solar module, comprising:
    a preassembled connection box housing having a flat housing base having an opening and a connecting element for the connection of electrical wires with connection sockets; and
    a contact element having a first contact region and a second contact region, the first contact region being connected to the connecting element and the second contact region extending from the first contact region diagonally with respect to the first contact region, the second contact region having a rounded contact section at least partially disposed outside the connection box housing, the second contact region partially extending beyond the opening provided in the housing base;
    wherein the connection sockets and the contact element are built-in to the preassembled housing.

13. The connection box of claim 12, wherein the contact element is made from spring steel.

14. The connection box of claim 12, wherein the connection box housing includes a housing lid.

15. The connection box of claim 12, wherein the housing base is provided with a further opening and the rounded contact section is at least partially arranged in the further opening in the housing base.

16. The connection box of claim 15, wherein the connecting element is arranged on the housing base.

* * * * *